United States Patent
Shen et al.

(10) Patent No.: US 9,122,361 B2
(45) Date of Patent: Sep. 1, 2015

(54) TOUCH PANEL TESTING USING MUTUAL CAPACITOR MEASUREMENTS

(75) Inventors: Guozhong Shen, San Jose, CA (US); Bart DeCanne, Sunnyvale, CA (US); Kenneth W. Knox, Palo Alto, CA (US); Muhammad Umair, Santa Clara, CA (US); Syed F. Ahmad, Sunnyvale, CA (US)

(73) Assignee: Qualcomm Technologies, Inc., San Diego, CA (US)

( * ) Notice: Subject to any disclaimer, the term of this patent is extended or adjusted under 35 U.S.C. 154(b) by 225 days.

(21) Appl. No.: 13/472,009

(22) Filed: May 15, 2012

(65) Prior Publication Data

US 2012/0293455 A1 Nov. 22, 2012

Related U.S. Application Data

(60) Provisional application No. 61/488,119, filed on May 19, 2011, provisional application No. 61/495,139, filed on Jun. 9, 2011.

(51) Int. Cl.
| | |
|---|---|
| G06F 3/045 | (2006.01) |
| G01R 31/02 | (2006.01) |
| G01R 31/12 | (2006.01) |
| G06F 3/044 | (2006.01) |
| G06F 3/041 | (2006.01) |

(52) U.S. Cl.
CPC .............. *G06F 3/044* (2013.01); *G06F 3/0418* (2013.01)

(58) Field of Classification Search
CPC ................................ G06F 3/0418; G06F 3/044
USPC .................................................. 345/174, 156
See application file for complete search history.

(56) References Cited

U.S. PATENT DOCUMENTS

| | | | |
|---|---|---|---|
| 7,808,255 B2 | 10/2010 | Hristov et al. | |
| 7,821,274 B2 | 10/2010 | Philipp et al. | |
| 7,821,502 B2 | 10/2010 | Hristov | |
| 7,864,160 B2 | 1/2011 | Geaghan et al. | |
| 7,932,898 B2 | 4/2011 | Philipp et al. | |
| 2006/0192752 A1* | 8/2006 | Ando | 345/156 |
| 2010/0044122 A1 | 2/2010 | Sleeman et al. | |
| 2010/0156811 A1 | 6/2010 | Long et al. | |
| 2010/0156846 A1 | 6/2010 | Long et al. | |
| 2010/0258360 A1 | 10/2010 | Yilmaz | |
| 2011/0050617 A1* | 3/2011 | Murphy et al. | 345/174 |
| 2011/0057905 A1* | 3/2011 | Yu et al. | 345/174 |
| 2012/0268413 A1* | 10/2012 | Narasimhan et al. | 345/174 |

* cited by examiner

*Primary Examiner* — Kumar Patel
*Assistant Examiner* — Kuo Woo
(74) *Attorney, Agent, or Firm* — Weaver Austin Villeneuve & Sampson, LLP

(57) ABSTRACT

A capacitive touch panel is tested for the presence or absence of short and open circuits in drive and sense lines without the use of a tool that touches the surface of the panel. During a first stage of testing, drive lines of the touch panel are sequentially driven while the remaining drive lines are floated. Sense lines are read to indicate whether a driven drive line is shorted to an adjacent drive line, an open circuit, or coupled to a sense line that is an open circuit. During a second stage of testing, drive lines are driven while alternate sense lines are floated or enabled. The signals on the enabled sense lines are acquired to indicate whether the enabled sense lines are shorted to adjacent sense lines. This second stage can be repeated, switching the roles of the sense lines, to determine the locations of short and/or open circuits.

20 Claims, 8 Drawing Sheets

TOUCH PANEL TESTING USING MUTUAL CAPACITOR MEASUREMENTS

CROSS-REFERENCE TO RELATED APPLICATIONS

The present application claims the benefit under 35 U.S.C. §119(e) of U.S. Provisional Application Ser. No. 61/488,119, entitled PANEL TEST METHOD BASED ON MUTUAL CAPACITOR MEASUREMENT, filed on May 19, 2011; and U.S. Provisional Application Ser. No. 61/495,139, entitled METHOD OF TESTING A TOUCH PANEL USING MUTUAL CAPACITOR MEASUREMENTS, filed on Jun. 9, 2011. U.S. Provisional Application Ser. Nos. 61/488,119 and 61/495,139 are herein incorporated by reference in their entireties.

BACKGROUND

A touch panel is a human machine interface (HMI) that allows an operator of an electronic device to provide input to the device using an instrument such as a finger, a stylus, and so forth. For example, the operator may use his or her finger to manipulate images on an electronic display, such as a display attached to a mobile computing device, a personal computer (PC), or a terminal connected to a network. In some cases, the operator may use two or more fingers simultaneously to provide unique commands, such as a zoom command, executed by moving two fingers away from one another; a shrink command, executed by moving two fingers toward one another; and so forth.

A touch screen is an electronic visual display that incorporates a touch panel overlying a display to detect the presence and/or location of a touch within the display area of the screen. Touch screens are common in devices such as all-in-one computers, tablet computers, satellite navigation devices, gaming devices, and smartphones. A touch screen enables an operator to interact directly with information that is displayed by the display underlying the touch panel, rather than indirectly with a pointer controlled by a mouse or touchpad. Capacitive touch panels are often used with touch screen devices. A capacitive touch panel generally includes an insulator, such as glass, coated with a transparent conductor, such as indium tin oxide (ITO). As the human body is also an electrical conductor, touching the surface of the panel results in a distortion of the panel's electrostatic field, measurable as a change in capacitance.

SUMMARY

Techniques are described for testing a capacitive touch panel for the presence or absence of short circuits and open circuits in its drive and sense lines without the use of a tool that touches the surface of the panel. In one or more implementations, the techniques may be implemented as a test having two or more test stages (e.g., a first test stage and a second stage). During a first stage of the test, the drive lines of the touch panel are sequentially driven while the other drive lines are floated. The resulting signals on the sense lines are read to indicate whether the driven drive line is shorted to an adjacent drive line, is an open circuit, is coupled to a sense line that is an open circuit, or has neither short nor open circuits. During a second stage of the test, the drive lines are driven while alternate sense lines are floated or enabled. The signals on the enabled sense lines are read to indicate whether the enabled sense lines are shorted to adjacent sense lines. This second stage can be repeated, switching the roles of the alternate sense lines, to determine the actual locations of short and/or open circuits.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. The use of the same reference numbers and/or labels in different instances in the description and the figures may indicate similar or identical items.

DETAILED DESCRIPTION

Overview

Figure 1:
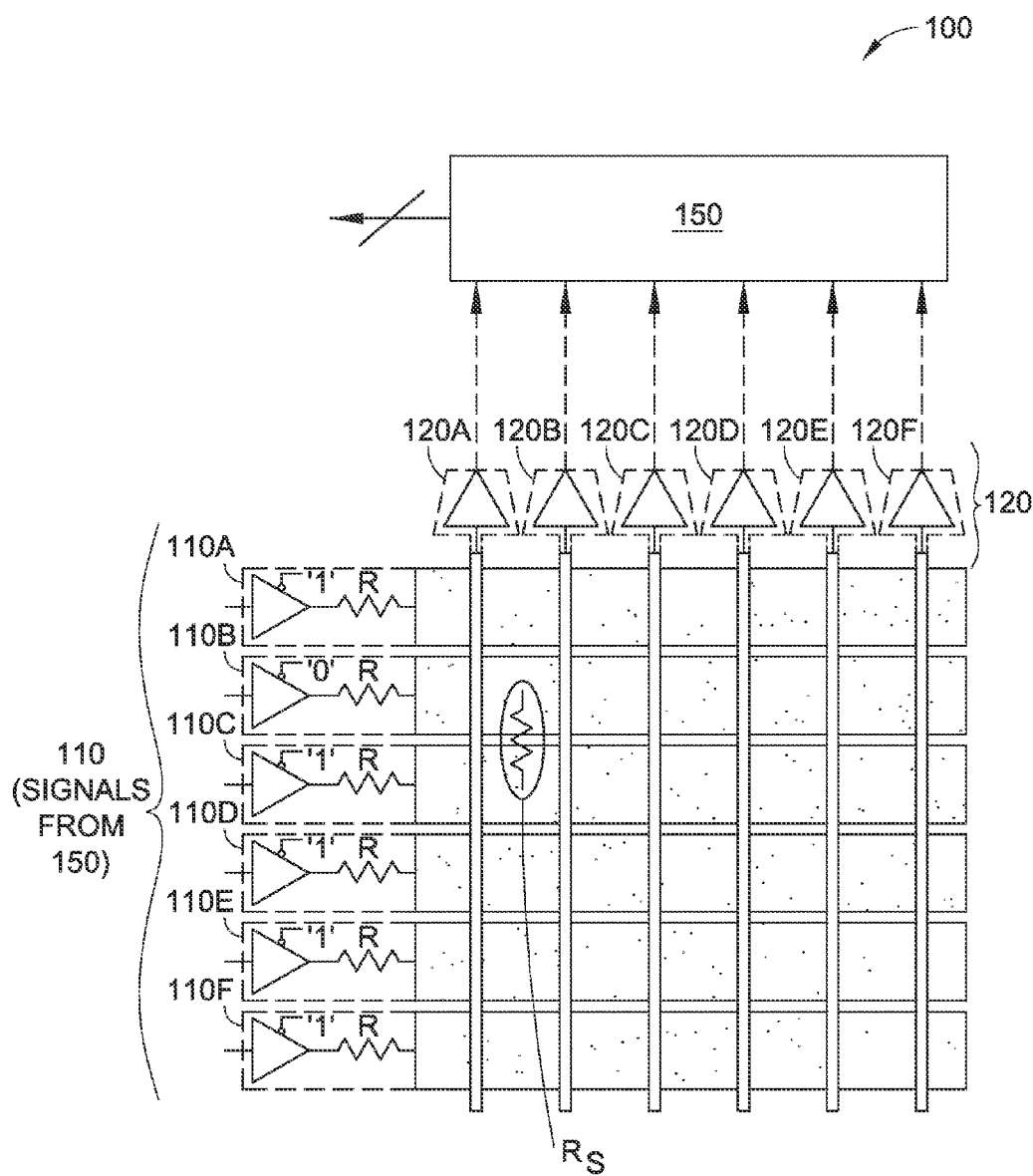
FIG. 1 is a diagrammatic illustration that depicts a short between adjacent drive lines in a capacitive touch panel having a grid of drive lines and sense lines.

Touch panels can have any number of defects that may be detected by testing during the manufacturing process. The touch panels can have short circuits and open circuits from poor solder connections on circuit boards or by other manufacturing defects. Capacitive touch panels are traditionally tested by systematically touching a tool comprised of one or more capacitive probes (objects) to the panel surface, simulating finger touches during normal use, and determining whether the touches are accurately detected by the panel. A faulty touch panel may fail to accurately detect one or more of the touches by the capacitive probes because of, for example, short or open circuits in the sense and drive lines of the touch panel circuitry.

During the test set up, the touch panel is secured in a text fixture (e.g., a jig or other tool) with components that touch capacitive probes (objects) to, and then lift those probes from, the surface of the panel. Any change in capacitance resulting from the touch is measured and compared to an expected value. A significant difference between the measured and expected values indicates a defect in the touch panel. When the test is complete, the touch panel is removed from the test fixture.

To adequately test a touch panel, the capacitive probes must be touched to the panel and measurements taken at multiple locations on the touch panel surface. Thus, testing of touch panels is a time-consuming process, especially for large touch panels. The time to connect and disconnect the touch panel from the text fixture adds to the total test time, decreasing test throughput and increasing labor costs. The test process also requires expensive test fixtures (e.g., test jigs and/or other positioning tools). Additionally, if the capacitive probes are not positioned accurately on the touch panel, such that a touch is not detected where expected, the test can incorrectly signal an error, e.g., a "false positive." Moreover, if the capacitive probes are placed against the touch panel with excessive force the touch panel can be damaged.

Accordingly, the techniques described herein allow a capacitive touch panel to be tested for the presence of short and open circuits in its drive and sense lines without the use of a tool that touches the surface of the panel. The techniques may be implemented as a test having two or more test stages (e.g., a first test stage and a second stage). During a first stage of the test, each of the drive lines of the touch panel is sequentially driven (e.g., enabled or activated) while the other drive lines are floated (e.g., left in a disable or inactivated state). The resulting signals on the sense lines are acquired to indicate whether the driven drive line is shorted to an adjacent drive line, is an open circuit, is coupled to a sense line that is an open circuit, or has neither shorts nor opens. During a second stage of the test, the drive lines are all driven (e.g., enabled or activated) while alternate sense lines are floated (e.g., disabled or deactivated) and the remaining sense lines are enabled (e.g., activated). The signals on the enabled sense lines are acquired to indicate whether the enabled sense lines are shorted to adjacent sense lines. The second stage can be repeated, switching the roles of the alternate and remaining sense lines, to determine the actual locations of any shorts.

By driving and floating drive and sense lines in particular patterns, shorts and opens can be detected without "external touches" on the surface of the panel. Thus, the techniques facilitate testing of touch panels that does not require specialized text fixtures (e.g., text jigs, external capacitive probes, or other expensive test equipment) that must be calibrated. Moreover, the testing is faster, less error prone, and less expensive than prior test methods. In implementations, testing of a touch panel can be performed in fifty milliseconds (50 ms) or less, depending on the speed of the processors used.

Example Implementation

In the example implementation described below, testing occurs in two stages. In the first stage, opens in the drive/sense lines and shorts between drive lines are detected by sequentially driving each drive line, allowing the others to float, and reading the sense lines. Different voltages on the sense lines indicate the occurrence of shorts and opens. In the second stage, any shorts between adjacent sense lines are detected and, optionally, located.

First Stage

FIG. 1 depicts a touch panel 100 in which a first stage of a test in accordance with an example implementation of the present disclosure may be implemented. The touch panel 100 may comprise a capacitive touch panel that includes drive lines (electrodes) 110A-110F (collectively, 110), such as cross-bar ITO drive traces/tracks, arranged next to one another (e.g., along parallel tracks, generally parallel tracks, and so forth). As shown, the drive lines 110 are elongated (e.g., extending along a longitudinal axis). For example, each drive line 110 may extend along an axis on a supporting surface, such as a substrate of the touch panel 100. The drive lines 110 have a pitch (e.g., a substantially repetitive spacing between adjacent axes of the drive lines 110). In implementations, the drive lines 110 also have a characteristic spacing comprising a minimum distance between adjacent edges of the drive lines 110.

The touch panel 100 also includes sense lines (electrodes) 120A-120F (collectively, 120), such as cross-bar ITO sensor traces/tracks, arranged next to one another across the drive lines 110 (e.g., along parallel tracks, generally parallel tracks, and so forth). The sense lines 110 are elongated (e.g., extending along a longitudinal axis). For instance, each sensor electrode 120 may extend along an axis on a supporting surface, such as a substrate of the touch panel 100. The sense lines 120 also have a pitch (e.g., a substantially repetitive spacing between adjacent axes of the sense lines 120). In implementations, the sense lines 120 also have a characteristic spacing comprising a minimum distance between adjacent edges of the sense lines 120.

One or more capacitive touch panels 100 can be included with a touch screen assembly. The touch screen assembly may include a display screen, such as an LCD screen, where the sensor layer and the drive layer are sandwiched between the LCD screen and a bonding layer, e.g., with a protective cover such as glass attached thereto. The protective cover may include a protective coating, an anti-reflective coating, and so forth. The protective cover may comprise a touch surface, upon which an operator can use one or more fingers, a stylus, and so forth to input commands to the touch screen assembly. The commands can be used to manipulate graphics displayed by, for example, the LCD screen. Further, the commands can be used as input to an electronic device connected to a capacitive touch panel 100, such as a multimedia device or another electronic device.

As shown in FIG. 1, the drive lines 110 and the sense lines 120 define a coordinate system where each coordinate location (pixel) comprises a capacitor formed at each intersection between one of the drive lines 110 and one of the sense lines 120. Thus, the drive lines 110 are configured to be connected to an electrical current source (e.g., from a touchscreen controller (TSC) 150) for generating a local electrostatic field at each capacitor, where a change in the local electrostatic field generated by a finger and/or a stylus at each capacitor causes a decrease in capacitance associated with a touch at the corresponding coordinate location. In this manner, more than one touch can be sensed at differing coordinate locations simultaneously (or at least substantially simultaneously). In implementations, the drive lines 110 can be driven by the electrical current source in parallel, e.g., where a set of different signals are provided to the drive lines 110. In other implementations, the drive lines 110 can be driven by the electrical current source in series, e.g., where each drive line 110 or subset of drive lines 110 is driven one at a time.

The sense lines 120 are electrically insulated from the drive lines 110 (e.g., using a dielectric layer, and so forth). For example, the sense lines 120 may be provided on one substrate (e.g., comprising a sense layer disposed on a glass substrate), and the drive lines 110 may be provided on a separate substrate (e.g., comprising a drive layer disposed on another substrate). In this two-layer configuration, the sense layer can be disposed above the drive layer (e.g., with respect to a touch surface). For example, the sense layer can be positioned closer to a touch surface than the drive layer. However, this configuration is provided by way of example only and is not meant to be restrictive of the present disclosure. Thus, other configurations can be provided where the drive layer is positioned closer to the touch surface than the sense layer, and/or where the sense layer and the drive layer comprise the same layer. For instance, in a 1.5-layer implementation (e.g., where the drive layer and the sense layer are included on the same layer but physically separated from one another), one or more jumpers can be used to connect portions of a drive line 110 together. Similarly, jumpers can be used to connect portions of a sense line 120 together.

Thus, as shown in FIG. 1, the touch panel 100 may be viewed as including a grid of drive lines 110 and sense lines 120. The drive lines 110 receive drive signals from the touchscreen controller (TSC) 150, while signals generated on the sense lines 120 are routed to the TSC 150 for processing. During operation, the TSC 150 generates signals on the drive lines 100. Corresponding signals sensed on the sense lines 120 indicate the location of a touch by one or more capacitive objects (e.g., fingers, styluses, and so forth) on the surface of the touch panel 100. Consequently, the locations of touches by the capacitive objects may be difficult or impossible to determine if the drive electrodes 110 and sense electrodes 120 are shorted together or have open circuits. Accordingly, FIG. 1 illustrates two drive lines 110 (e.g., the drive lines 110B and 110C) shorted together. In FIG. 1, this short is represented as a resistance labeled "$R_S$." As described below, specific values read on the sense lines 120 during testing indicate the presence of (a) shorts between adjacent ones of the drive lines 110, or (b) opens on the drive lines 110 or the sense lines 120, or (c) none of these defects.

In the example illustrated in FIG. 1, the drive line 110A includes an active-low drive element, meaning the drive line 110A is enabled ("driven") when a "0" (or inactive drive signal) is applied to its enable pin and disabled ("floating") when a "1" (or active drive signal) is applied to its enable pin. In the accompanying figure, the drive line 110A also includes a resistive element that models a resistance on a conductive strip forming the grid. In the example shown, the drive line 110B is enabled and the remaining drive lines 110A and 110C-110F are floating (disabled). When testing for a short between the drive line 110B and an adjacent drive line (e.g., drive lines 110A or 110C) or for an open between the drive line 110B and one of the sense lines 120, the drive line 110B is driven, while the remaining drive lines 110A and 110C-110F are left floating. The sense lines 120 are then read simultaneously. As described in more detail below, the presence of a signal on the sense lines 120 at about an "expected" or "normal" value (defined below) indicates that there are no shorts or opens, a signal about twice the normal value indicates a short between the drive line 110C and an adjacent drive line (110B or 100C), while a signal having a value of or close to "0" indicates an open circuit on the drive line 110C or on the sense line on which the "0" value was read. The principle behind this determination is described with reference to FIGS. 2A through 2C.

Figure 2A:
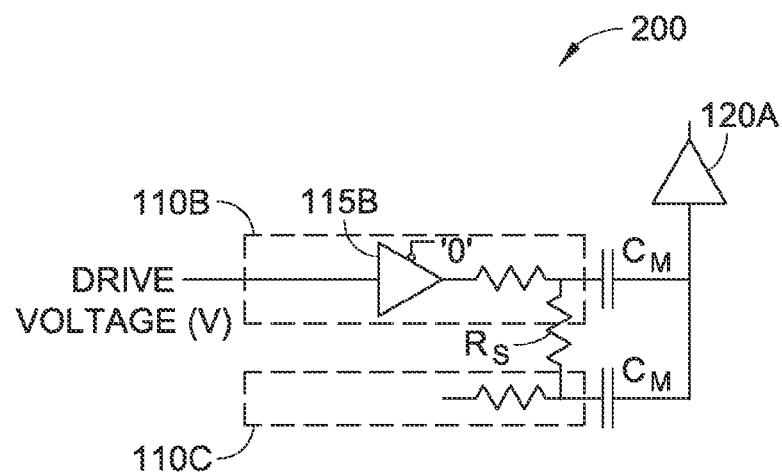
FIG. 2A is a diagram that illustrates a functional equivalent circuit of an enabled drive line and an adjacent floating drive line when the two drive lines are shorted together, with the sense lines read in accordance with the present disclosure.
Figure 2B:
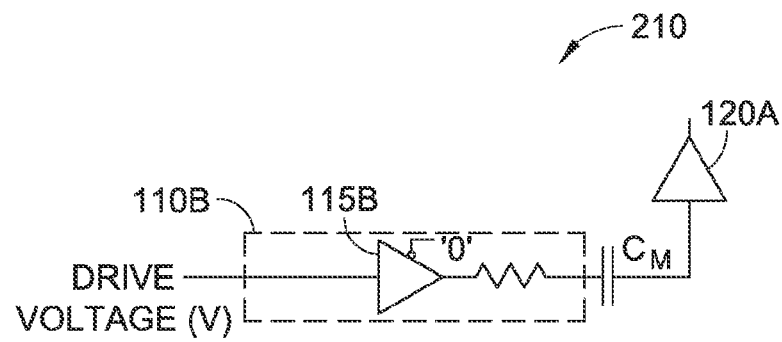
FIG. 2B is a diagram that illustrates a functional equivalent circuit of an enabled drive line and an adjacent floating drive line when the two drive lines are not shorted together, with the sense lines read in accordance with an example implementation of the present disclosure.

FIG. 2A illustrates a circuit model 200 of the drive line 110B shorted to the drive line 110C, where, as described above, the resistor $R_S$ models the short, and the capacitor $C_M$ is a node capacitor of the touch panel 100, which models the mutual capacitance. For example, a node capacitor $C_M$ can be modeled at the intersection of each of the drive lines 110 and each of the sense lines 120. When the drive voltage into the drive element 115B is V (e.g., where V represents the amplitude of the voltage waveform), each sense line 120A-120F senses a charge in a first predetermined range of about $C_M V$ (the "normal" value discussed above) as shown in the circuit model 210 illustrated in FIG. 2B. When adjacent drive lines are shorted, however, the sense line 110B is coupled to two node capacitors $C_M$ driven by the voltage V, so the charge entering the sense line 120A will have a value in a second predetermined range of about $2C_M V$ (approximately twice the "normal" value), depending on the value of $R_S$. The difference between the value $2C_M V$ and $C_M V$ can be sufficiently large to be measured, allowing a short between adjacent drive lines to be detected. When a drive line 110 or sense line 120 is open, the charge that enters the corresponding sense line 120 is in a third predetermined range that includes "0." Thus, when the drive line 110B is open with the sense line 120A, or the sense line 120A has an open, the signal measured on the sense line 120A is within the third predetermined range, at least approximately zero volts (0V).

Because signals can vary slightly due to manufacturing variations, voltage variations, and so forth, the testing process (method) described herein below compares signal values to first, second, and third predetermined ranges, instead of to exact values. For example, a voltage on a sense line 120 can be slightly less or slightly more than $C_M V$, though the drive/sense line has no shorts or opens. Thus, when a signal on the corresponding sense line 120 falls within the first predetermined range (e.g., $C_M V \pm \Delta 1$), the testing method (which may implemented by the touchscreen controller (TSC) 150 of FIG. 1) recognizes the corresponding drive/sense lines 110/120 as containing no shorts or opens, as discussed above. The "acceptable" predetermined range can be determined based on data analysis of known good touch panels and/or bad touch panels. Acceptable first and second predetermined ranges, indicating defects as discussed above, can be similarly determined and used in implementations of the testing process discussed herein. To simplify the discussion that follows, the values "$C_M V$," "$2C_M V$," and "0" may be used to refer to the first, second, and third predetermined ranges, respectively.

Figure 2C:
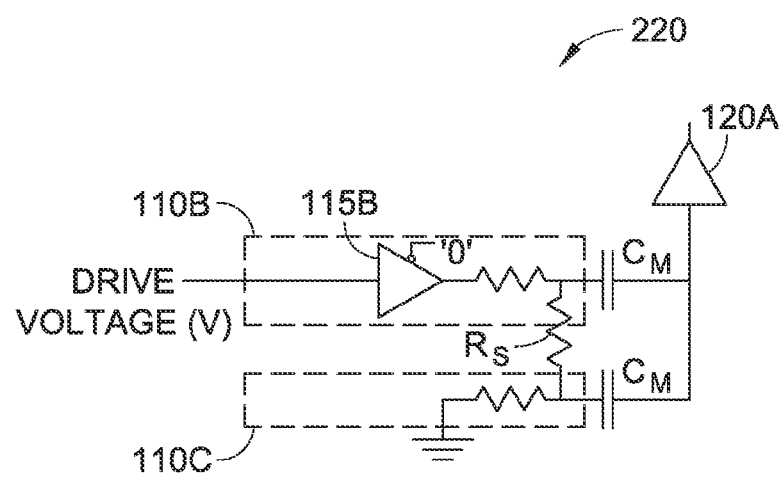
FIG. 2C is a diagram that illustrates a functional equivalent circuit of an enabled drive line and an adjacent grounded drive line when the two drive lines are shorted together, to better illustrate one principle of the present disclosure.

When one drive line 110 is driven, the remaining drive lines 110 are floating not grounded. If the remaining drive lines 110 were grounded, as shown in the circuit model 220 illustrated in FIG. 2C, shorts are not detected. Referring to FIG. 2C, the input voltage is V, but because two resistors are effectively in parallel, the input voltage is reduced by half, to 0.5V, while the capacitance is doubled ($2C_M$). The voltage on the sense line is thus $(0.5V)(2C_M)$ or $C_M V$, the same voltage generated when no short is present. Thus, grounding the remaining drive lines 110 would prevent detection of a short using the present techniques.

It will be appreciated that, to fully test the touch panel 100, or at least a significant portion of its area, the first stage can be implemented to test connections between multiple ones of the drive lines 110 and between multiple ones of the drive lines 110 and the sense lines 120. In the example method 300 illustrated in FIG. 3, each of the drive lines 110 is sequentially activated to test the connections between that drive line 110 and its neighboring drive lines 110 and between that drive line 110 and each of the sense lines 120. With the drive lines 110 driven sequentially (e.g., one-by-one), a single test image may be used, and, depending on the speed of the processor used, the first stage of testing can be performed in less than at least about ten milliseconds (10 ms).

Figure 3:
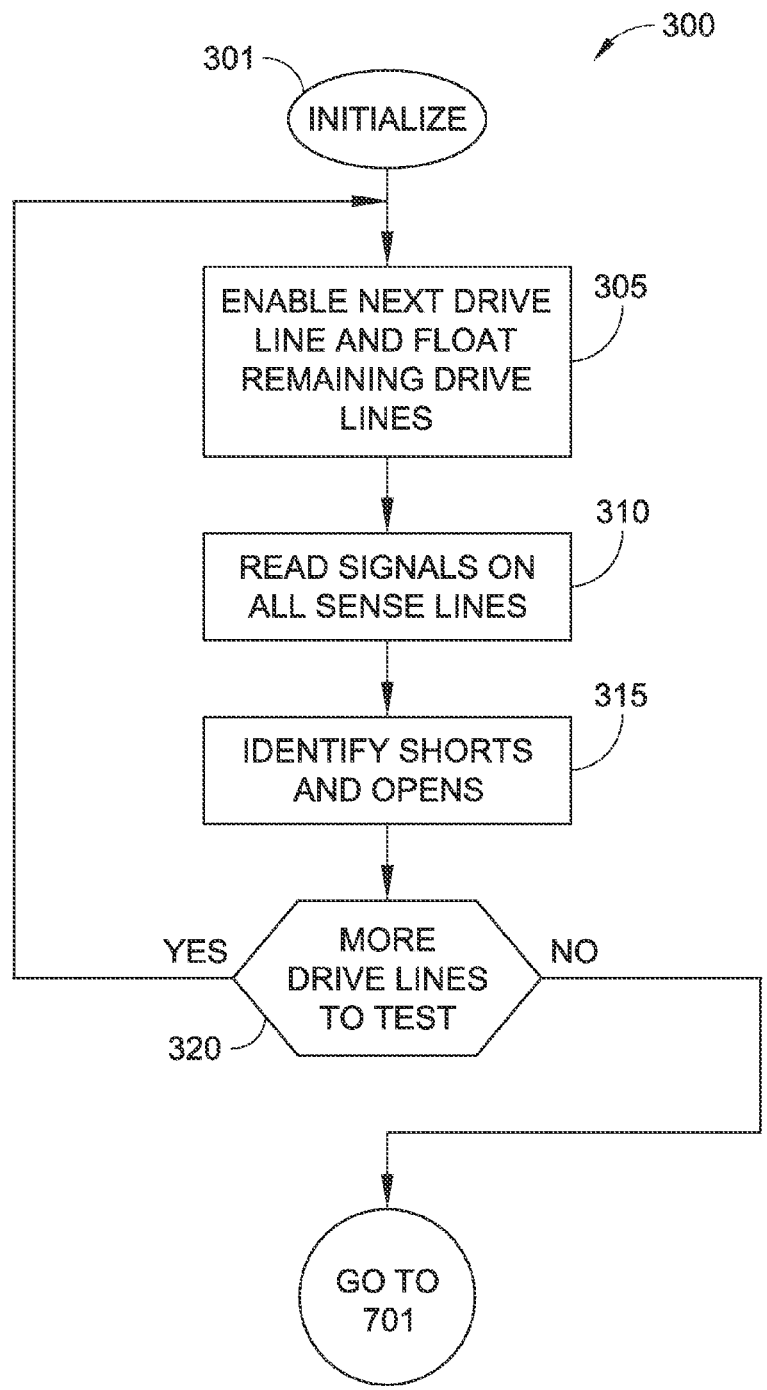
FIG. 3 is a flow diagram that illustrates a method for determining shorts between adjacent drive lines or opens between drive and sense lines in accordance with an example implementation of the present disclosure.

FIG. 3 illustrates a process (method) 300 for performing the first stage of testing of a touch panel (e.g., the touch panel 100) in accordance with an example implementation of the present disclosure. As shown, parameters of the test may first be initialized (Block 301). The next drive line to be tested is enabled and the remaining drive lines are floated (Block 305). For example, with reference to FIG. 1, the "next" drive line to be tested is initialized to the first drive line, the drive line 110A. Thus, as shown, the drive line 110A is enabled and the remaining drive lines 110B-110F are disabled, and left floating. Signals from the sense lines are then read (Block 310). For example, as shown in FIG. 1, all of the sense lines 120 may be read concurrently.

Shorts and opens are then identified (Block 315). As described above in the discussions of FIGS. 2A through 2C, a signal on any of the sense lines 120 that falls outside of the first predetermined range (e.g., differs sufficiently from $C_M V$), indicates a defect. A value within the second predetermined range (e.g., a value within a predetermined range of 2 $C_M V$) indicates a short between the drive line 110A and its only adjacent drive line 110B. A value within the third predetermined range (e.g., a value within a predetermined range of "0") indicates an open circuit on the drive line 110A or an open circuit on the corresponding sense line 120 with the zero volt (0V) reading. Using these values, shorts and opens can be identified and, if desired, recorded. For example, when a short or an open is identified, the touch panel may either be discarded as unusable, or identified (e.g., tagged) to be repaired/refurbished. In this example, the signal read on each of the lines 120 is $C_M V$, indicating: (1) no shorts between the drive line 110A and any adjacent drive line (110B) and (2) no open circuits on the drive line 110A or any of the sense lines 120A-120F.

A determination is then made whether there are more drive lines to test (Decision Block 320). When a determination is made ("YES" at Decision Block 320), that there are more drive lines to test (e.g., drive lines 110B-110F), the method (process) 300 loops back to enable the next drive line while floating the remaining drive lines (Block 305), where the next drive line (e.g., drive line 110B) is selected.

This state (i.e., drive line 110B enabled) is shown in FIG. 1. In this example, the process 300 is repeated. When the drive line 110B is enabled and driven with the voltage V, the sense lines 120A-120F may have a voltage $2C_M V$, indicating a short between the drive 110B and an adjacent drive line (110A or 110C). The location of the short can be determined, if necessary, by recalling that the prior iteration of the process 300 did not indicate a short between the drive lines 110A and 110B, thereby indicating that the short is between the drive lines 110B and 110C; by determining, in a later step, that the drive line 110C is shorted to an adjacent drive line (e.g., drive line 110B or drive line 110D, or both drive line 110B and drive line 110D), but not to the drive line 110D; or by using other techniques (e.g., additional testing using a fixture employing capacitive probes, and so forth).

Figure 7:
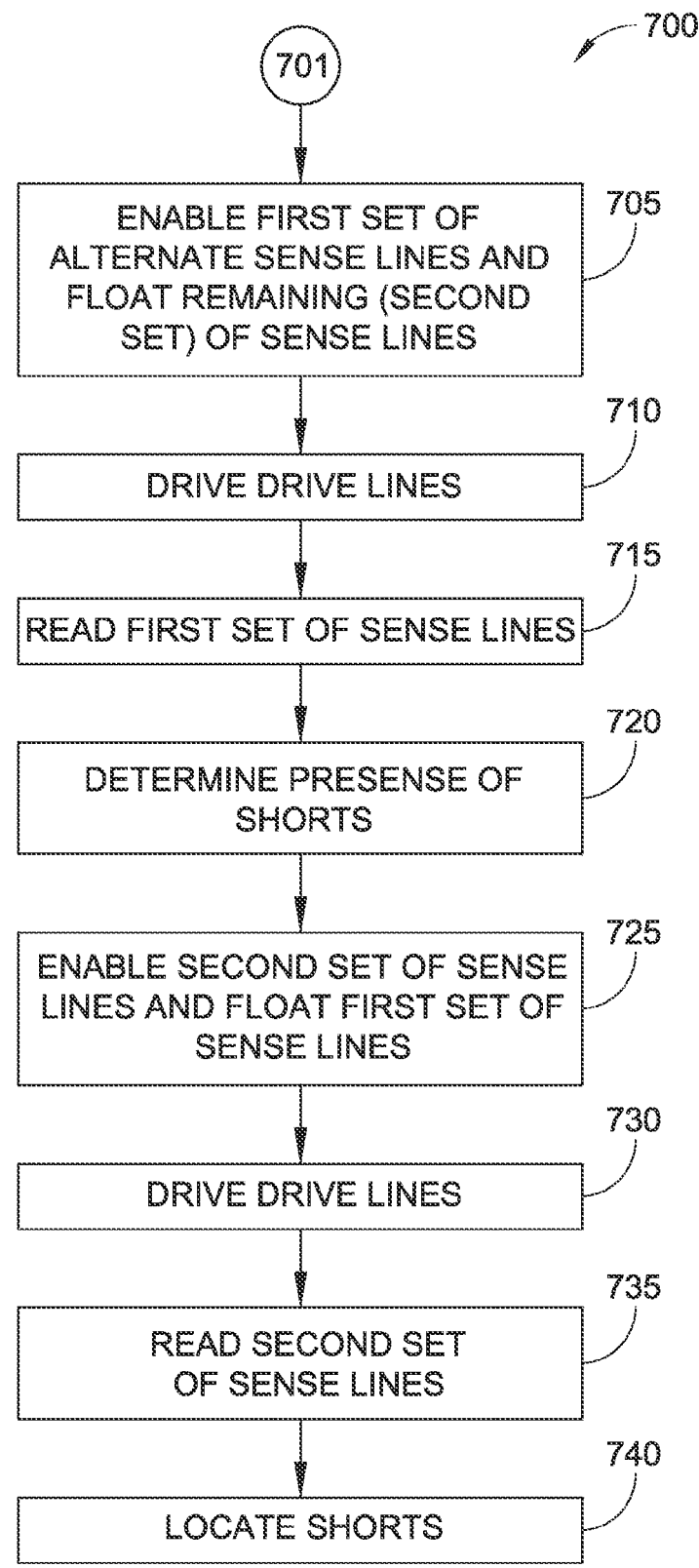
FIG. 7 is a flow diagram that illustrates a method for determining shorts between adjacent sense lines in accordance with an example implementation of the present disclosure.

When a desired number of (e.g., all of, a random sampling of, etc.) the drive lines (e.g., drive lines 110A-110F) have been tested, e.g., a determination is made that there are no more drive lines to test ("NO" at Decision Block 320), the process 300 proceeds to the second stage of testing (Block 701), an example of which is illustrated by process (method) 700 shown in FIG. 7. Before proceeding to the second stage, it is contemplated that the test process 300 described can have located all the shorts (if any) between adjacent ones of the drive lines 110, any opens in the drive lines 110, and any opens in the sense lines 120.

Second Stage

The second stage of the test detects shorts between adjacent sense lines 120. In the second stage, the drive lines 110A-110F are driven sequentially, as in normal use, and the sense lines 120A-120F are sensed in two phases. In each phase, half of the sense lines 120A-120F (e.g., sense lines 120B, 120D, and 120F of the touch panel 100 shown in FIG. 1) are enabled and the remaining half (e.g., sense lines 120A, 120C, and 120E of the touch panel 100 shown in FIG. 1) are floating.

Figure 4:
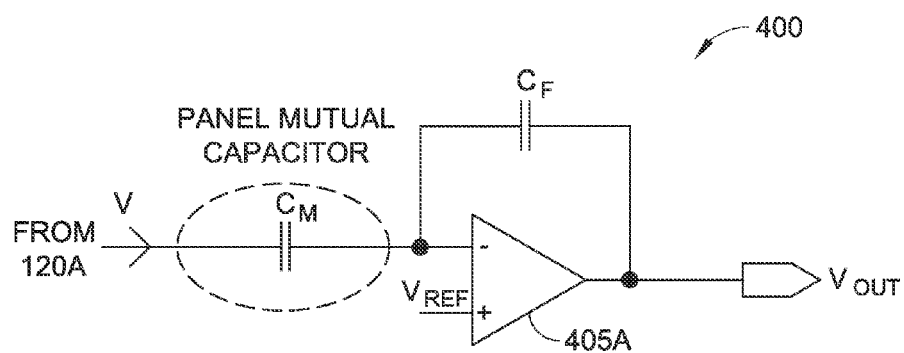
FIG. 4 is a diagram that illustrates a simplified model of a sense channel low-noise amplifier circuit.

FIG. 4 illustrates a circuit model 400 of a sense channel low-noise amplifier (LNA) circuit that forms part of the touch screen controller (TSC) 150 in FIG. 1. Each of the outputs of the sense lines 120 is coupled to a sense channel LNA circuit such as the sense channel LNA circuit 400. The sense channel LNA circuit 400 includes an amplifier 405A with a positive terminal connected to a reference voltage $V_{REF}$ and a negative terminal coupled in parallel to its output $V_{OUT}$ through a capacitor $C_F$, thereby forming a feedback loop, and to a voltage V through the panel mutual capacitor $C_M$, discussed above. The voltage V is generated on one of the sense lines 120. The LNA circuit 400 functions as a charge amplifier circuit that translates a charge signal into a voltage signal. Using the formula for an amplifier output, and considering only alternating current (AC) signals, the output voltage $V_{OUT}$ may be determined from the value of the panel mutual capacitor $C_M$, the value of the voltage V, and the value of the capacitor $C_M$ by the equation $$V_{OUT}=C_M V/C_F.$$

Figure 5A:
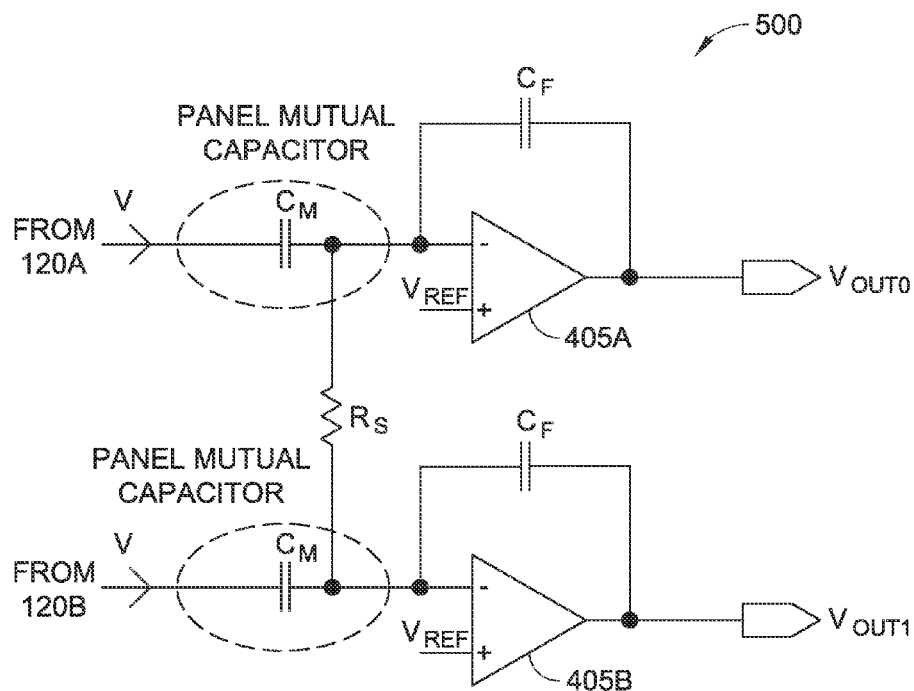
FIG. 5A is a diagram that illustrates a simplified model of shorted sense lines in a normal case.

FIG. 5A illustrates a circuit model 500 depicting two sense lines (e.g., sense lines 120A and 120B) shorted together. Although the total charge collected from the panel mutual capacitors $C_M$, is $2C_M V$, the charge is transferred into (divided between) both feedback capacitors $C_F$. Accordingly, each of the shorted sense lines 120A and 120B carries the charge $C_M V$, and the values at the outputs $V_{OUT0}$ and $V_{OUT1}$ are $C_M V/C_F$. Thus, because the voltage is at least approximately the same as in instances when no short has occurred, shorts are not detected.

Figure 5B:
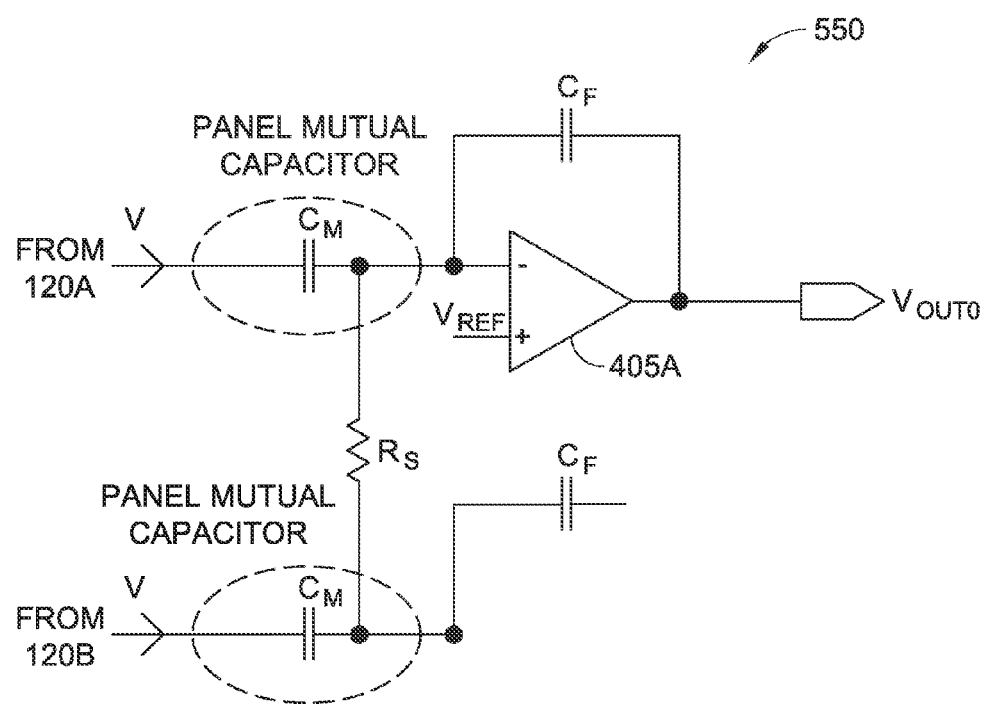
FIG. 5B is a diagram that illustrates a simplified model of shorted sense lines when one channel of a low-noise amplifier is disabled.

FIG. 5B illustrates a circuit model 550 in which a sense line 120 (e.g., the LNA 405 of a sense line 120) is disabled, in accordance with an example implementation of the present disclosure, allowing a short between adjacent sense lines (e.g., sense lines 120A and 120B) to be detected. By disabling the LNA 405B (illustrated by removing the LNA 405B from FIG. 5B), the LNA's input and output become high impedance. The disabled sense line 120B becomes a floating capacitor. Because all the charge is now directed into one sense channel (e.g., sense line 120A), the output voltage $V_{OUT0}=2C_M V/C_F$. Because $V_{OUT0}$ differs when a short occurs (e.g., $V_{OUT0}=2C_M V/C_F$) and when one does not (e.g., $V_{OUT0}=C_M V/C_F$), shorts may be detected. Thus, as shown in FIGS. 4, 5A, and 5B, voltages indicating the presence or absence of shorts between sense lines 120 can be generated by enabling and floating the sense lines 120 in a predetermined pattern.

Figure 6A:
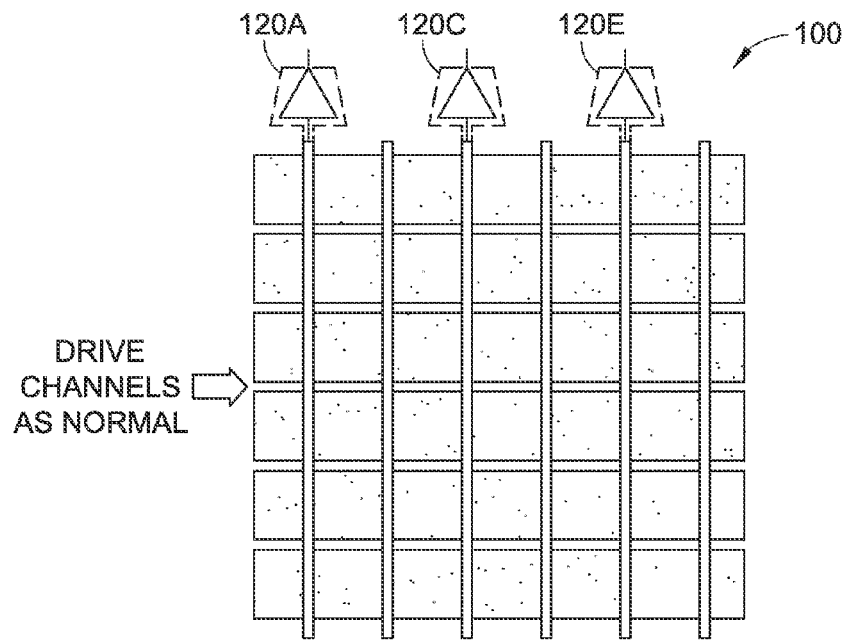
FIGS. 6A and 6B are diagrammatic illustrations that depict a capacitive touch panel when odd and even sense lines, respectively, are measured to determine shorts between adjacent sense lines in accordance with an example implementation of the present disclosure.
Figure 6B:
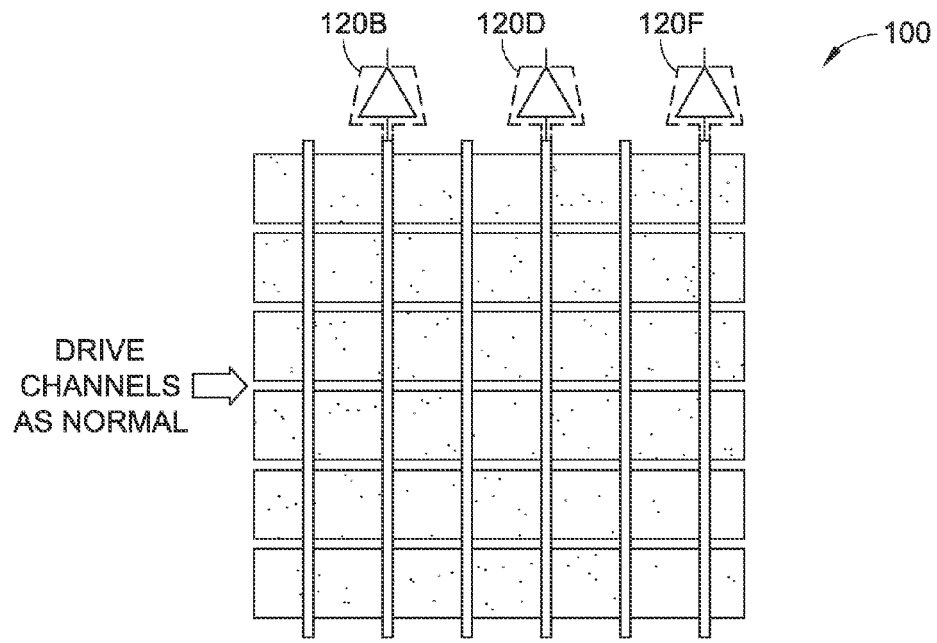

FIG. 6A illustrates the touch panel 100 shown in FIG. 1 when the drive lines 110 are all driven, a first set of alternate ones of the sense lines 120 (e.g., sense lines 120A, 120C, and 120E) are enabled, and a second set of the remaining sense lines 120 (e.g., sense lines 120B, 120D, and 120F), also alternating, are floating (disabled), and the signals on the first set of sense lines 120 (e.g., sense lines 120A, 120C, and 120E) are read. (For reference, hereinafter, the first set of sense lines 120 (e.g., sense lines 120A, 120C, and 120E) are referred to with the reference numeral 120(FIRST), and the second set of sense lines 120 (e.g., sense lines 120B, 120D, and 120F) are referred to with the reference numeral 120 (SECOND)). Using these readings, the presence of shorts between the sense lines 120(FIRST) and the sense lines 120 (SECOND) can be detected. FIG. 6B illustrates the touch panel 100 shown in FIG. 1 when the roles are reversed: e.g., the drive lines 110 are all driven, the sense lines 120(SEC-OND) are enabled, the sense lines 120(FIRST), are floating (disabled), and the signals on the sense lines 120(SECOND) are read. As described in FIG. 7, using this second set of readings, the locations of shorts can be determined.

FIG. 7 illustrates a process (method) 700 for performing the second stage of testing of the touch panel 100 in accordance with an example implementation of the present disclosure. As shown, the process 700 may be initiated (Block 701), for example, following the first stage of testing illustrated in FIG. 3. A first set of alternate sense lines are enabled, and the remaining alternate sense lines (a second set of alternate sense lines) are disabled (floated) (Block 705). For example, as shown in FIGS. 1, 6A, and 6B, the first set of sense lines 120(FIRST) are enabled, while the second set of sense lines 120(SECOND) are floated. The drive lines are then driven (Block 710), and the first set of the sense lines are read (Block 715). For instance, as shown in FIG. 1, all of the drive lines 110 may be driven, and the sense lines of the first set of sense lines 120(FIRST) read. Based on this reading, a determination may be made whether a short exists between one or more of the sense lines (Block 720). Thus, as shown in FIG. 1, a determination is made whether a short exists between one or more sense lines of the first set of sense lines 120(FIRST) and a neighboring one of the second set of sense lines 120(SEC-OND). For example, a determination can be made that the sense line 120B is shorted to a neighbor (e.g., sense line 120A or sense line 120C, or both sense line 120A and sense line 120C). However, it should be noted that at this point no determination is made as to which sense lines 120 are shorted together (e.g., whether sense line 120B is shorted to sense line 120A, or sense line 120C, or both sense line 120A and sense line 120C). (This determination is made in Block 740, discussed below.)

Next, the first set of alternate sense lines are disabled (floated), and the second set of alternate sense lines are enabled (Block 725). For example, as shown in FIGS. 1, 6A, and 6B, the first set of sense lines 120(FIRST) are floated, while the second set of sense lines 120(SECOND) are floated. The drive lines are then driven (Block 730), and the second set of the sense lines are read (Block 735). For instance, as shown in FIG. 1, all of the drive lines 110 may be driven, and the sense lines of the second set of sense lines 120(SECOND) read. Based on this reading, a determination may be made whether a short exists between one or more of the sense lines (Block 740). Thus, as shown in FIG. 1, a determination is made whether a short exists between one or more sense lines of the second set of sense lines 120(SECOND) and a neighboring one of the first set of sense lines 120(FIRST). For example, a determination can be made that the sense line 120C is shorted to a neighbor (e.g., sense line 120B or sense line 120D, or both sense line 120B and sense line 120D).

Using the information regarding shorts between sense lines determined previously (in Block 720), shorts between sense lines can also be located (in Block 740). For example, when a determination is made (in Block 720) that the sense line 120B is shorted to a neighbor (e.g., sense line 120A or 120C), and a further determination is made (in Block 740) that the sense line 120A is also shorted to a neighbor, but the sense line 120C is not shorted to a neighbor, then a short between sense line 120A and sense line 120B may be determined to exist. Using the same test methodology, it can be determined whether the sense line 120B is shorted to both of the sense lines 120A and 120C. It will be appreciated that the sense lines 120 can be enabled and disabled in different combinations, the drive lines 110 driven, and the signals on the sense lines 120 read to determine the existence and locations of shorts in accordance with the principles of the present disclosure.

The test steps implemented in Blocks 705, 710, 715, and 720 may, for clarity of discussion, be referred to as a "first phase" of the second stage of the test, while the test steps implemented in Blocks 725, 730, 735, and 740 are referred to as the "second phase" of the second stage of the test. Accordingly, it will be appreciated that both the first phase and the second phase are performed when the actual locations of any shorts in the touch panel 100 are to be determined, such as to track and uncover defects in the touch panel 100 during the touch-panel fabrication process. However, when the test is performed merely to determine whether sense lines are shorted without determining the locations of the shorts, the first phase may be performed without performing the second phase. Thus, in the second stage, shorts between the sense lines 120A-120F, and, optionally, the locations of those shorts may be determined.

It will be appreciated that the process (method) 700 can be modified in accordance with the principles of the present disclosure to determine shorts between non-adjacent sense lines 120. As one example, again referring to FIG. 1, a short between the sense lines 120A and 120F is located by determining that (1) the sense line 120A and the sense line 120F are both shorted to another sense line and (2) none of the remaining sense lines 120B-120E are shorted to another sense line. Based on the foregoing discussion, those skilled in the art will now recognize other methods of determining shorts between non-adjacent sense lines may be possible. It will be appreciated that tests in accordance with the techniques of the present disclosure can be tailored depending on the specific layout of a touch panel. For example, some layouts (e.g., line spacing and device geometries) make it more likely that shorts or opens occur between particular ones of the drive and sense lines. Thus, tests in accordance with the techniques of the present disclosure can focus on the connections between these particular drive and sense lines.

Example Test System

Figure 8:
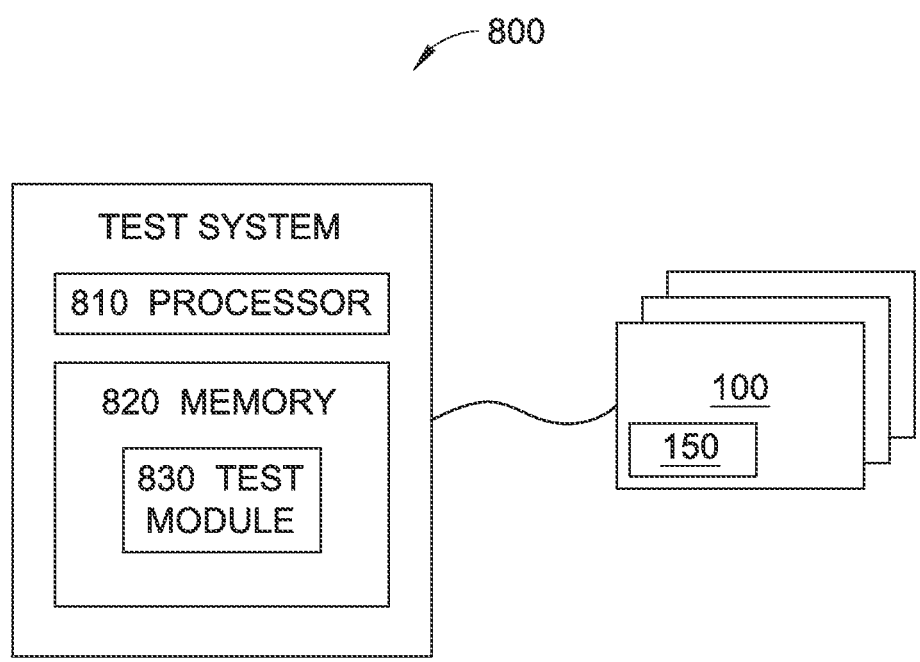
FIG. 8 is a block diagram that illustrates a touch panel undergoing testing using a test system in accordance with an example implementation of the present disclosure.

FIG. 8 illustrates a test system 800 coupled to the touch panel 100 undergoing testing in accordance with an example implementation of techniques of the present disclosure. The test system 800 may be configured in a variety of ways. In FIG. 1, the test system 800 is illustrated as including a processor 810 and a memory 820. The processor 810 provides processing functionality for the test system 100 and may include any number of processors, micro-controllers, or other processing systems, and resident or external memory for storing data and other information accessed or generated by the test system 100. The processor 810 may execute one or more software programs that implement the techniques and modules described herein. The processor 810 is not limited by the materials from which it is formed or the processing mechanisms employed therein and, as such, may be implemented via semiconductor(s) and/or transistors (e.g., electronic integrated circuits (ICs)), and so forth.

The memory 820 is an example of a non-transitory computer storage device that provides storage functionality to store various data associated with the operation of the test system, such as the software program and code segments mentioned above, computer instructions, and/or other data to instruct the processor 810 and other elements of the test system 800 to perform the techniques described herein. Although a single memory 820 is shown, a wide variety of types and combinations of memory may be employed. The memory 820 may be integral with the processor 810, stand-alone memory, or a combination of both. The memory may include, for example, removable and non-removable memory elements such as RAM, ROM, Flash (e.g., SD Card, mini-SD card, micro-SD Card), magnetic, optical, USB memory devices, and so forth.

The test system 800 is illustrated as including a test module 830, which is storable in memory 820 and executable by the processor 810. The test module 830 represents functionality to test capacitive touch panels 100 for short and open circuits in their drive and sense lines without the use of a tool that touches the surface of the panel 100. For example, the test module 830 may implement the techniques of the present disclosure (e.g., may implement the processes (methods) 300 and 700, in FIGS. 3 and 7, respectively) to test one or more touch panels 100 for short and open circuits in the drive and sense lines of the panels 100.

During the test setup, the test system 800 is coupled to the touch panel 100. The test system 800 interfaces with the touch screen controller (TSC) 150 (see also FIG. 1) to control the drive lines 110, read the sense lines 120, and process the signals on the sense lines 120, e.g., via the test module 830. During the first stage of the test, the test module 830 may cause the touch panel 100 to be operated in accordance with process (method) 300 of FIG. 3 (e.g., by furnishing instructions to control operation of the TSC 150), so that shorts or opens may be detected. During the second stage of the test, test module 830 may cause the touch panel 100 may be operated in accordance with the process (method) 700 of FIG. 7 (e.g., by furnishing instructions to control operation of the TSC 150), so that shorts between adjacent sense lines 120 may be detected, and, optionally, located. The test system 800 does not employ external capacitive probes ("fingers") or other objects to touch the surface of the touch panel 100, reducing test set up, execution, and tear down times, and reducing the possibility of incurring damage to the touch panel 100 itself.

Generally, any of the techniques described herein can be implemented using software, firmware, hardware (e.g., fixed logic circuitry), manual processing, or a combination of these implementations. The terms "module" and "functionality" as used herein generally represent software, firmware, hardware, or a combination thereof. The communication between modules in the test system 800 of FIG. 8 can be wired, wireless, or some combination thereof. In the case of a software implementation, for instance, the module represents executable instructions that perform specified tasks when executed on a processor, such as the processor 810 of the test system 800 shown in FIG. 8. The program code can be stored in one or more non-transitory computer storage devices, an example of which is the memory 820 associated with the test system 800 of FIG. 8.

It will be appreciated that the techniques described herein need not necessarily be limited to implementation as a "two stage" test. Instead, the discussion herein above of the test as being performed in test "stages" is for purposes of clarity of explanation of the techniques of the present disclosure. Thus, testing, in accordance with the techniques described, may be characterized as being performed in a single test stage or multiple test stages without departing from the scope and spirit of the present disclosure. Moreover, the terms "first stage" and "second stage" are used merely to identify the two test stages and do not necessarily suggest that the first stage must be performed before the second stage. Indeed, the second stage can be performed before the first stage. Furthermore, the two stages do not have to be performed together. In some test environments the first stage is performed without the second stage, and in other environments the second stage is performed without the first stage.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A capacitive touch panel comprising:
a plurality of drive lines arranged one next to another;
a plurality of sense lines arranged one next to another across the plurality of drive lines; and
a controller coupled to the plurality of drive lines and the plurality of sense lines, the controller operable to determine a location of an object when the object interfaces with a touch panel, the controller operable to:
drive at least a first one of the drive lines while floating the remaining drive lines; and
read the sense lines to determine whether a signal corresponding to the sense lines is outside of a predetermined range and identify a short or an open between the driven drive line and an adjacent ones of the remaining drive lines when the signal is outside the predetermined value, the predetermined range corresponding to a charge associated with a touch panel node.

2. The capacitive touch panel as recited in claim 1, wherein the controller is further configured to enable at least some of the sense lines while floating others of the sense lines in one or more different combinations and to read the sense lines for detecting a short between two or more of the sense lines.

3. The capacitive touch panel as recited in claim 2, wherein the controller is configured to enable a first set of alternate ones of the sense lines and float a second set of alternate ones of the sense lines.

4. The capacitive touch panel as recited in claim 3, wherein the controller is configured to thereafter enable the second set of alternate ones of the sense lines and floating the first set of alternate ones of the sense lines.

5. The capacitive touch panel as recited in claim 4, wherein the controller is configured to read the sense lines when the first set of alternate ones of the sense lines are enabled and the second set of alternate ones of the sense lines are floating.

6. The capacitive touch panel as recited in claim 5, wherein the controller is configured to again read the sense lines when the second set of alternate ones of the sense lines are enabled and the first set of alternate ones of the sense lines are floating.

7. A process for testing a capacitive touch panel having drive lines arranged one next to another and sense lines arranged one next to another across the drive lines, the process comprising:
driving, via a controller, at least a first one of the drive lines while floating the remaining drive lines, the controller coupled to the drive lines and the sense lines, the controller operable to determine a location of an object when the object interfaces with a touch panel;
reading, via the controller, the sense lines to receive a signal associated with respective sense lines;
determining, via the controller, whether the signal associated with at least one sense line of the sense lines is outside of a predetermined range, the predetermined range corresponding to a charge associated with a touch panel node; and identifying, via the controller, at least one of a presence or an absence of a short or an open between the driven drive line and an adjacent one of the remaining drive lines when the signal is outside the predetermined range.

8. The process as recited in claim 7, further comprising enabling at least some of the sense lines while floating others of the sense lines in one or more different combinations and reading the sense lines for detecting a short between two or more of the sense lines.

9. The process as recited in claim 8, wherein enabling at least some of the sense lines while floating others of the sense lines in one or more different combinations comprises enabling a first set of alternate ones of the sense lines and floating a second set of alternate ones of the sense lines.

10. The process as recited in claim 9, wherein enabling at least some of the sense lines while floating others of the sense lines in one or more different combinations further comprises thereafter enabling the second set of alternate ones of the sense lines and floating the first set of alternate ones of the sense lines.

11. The process as recited in claim 10, wherein reading the sense lines for detecting a short between two or more of the sense lines comprises reading the sense lines a first time when the first set of alternate ones of the sense lines are enabled and the second set of alternate ones of the sense lines are floating.

12. The process as recited in claim 11, wherein reading the sense lines for detecting a short between two or more of the sense lines comprises reading the sense lines a second time when the second set of alternate ones of the sense lines are enabled and the first set of alternate ones of the sense lines are floating.

13. The process as recited in claim 11, further comprising determining a location of the short between that at least two of the sense line by comparing the signals read from the sense lines the first time with the signals read from the sense lines the second time.

14. A test system configured for testing a capacitive touch panel assembly having drive lines arranged one next to another, and sense lines arranged one next to another across the drive lines, the capacitive touch panel assembly including, the controller configured to interface with the test system, the test system comprising:

a memory operable to store one or more modules; and a processor operable to execute the one or more modules to:

cause the controller coupled to the plurality of drive lines and the plurality of sense lines to drive at least a first one of the drive lines while floating the remaining drive lines, the controller configured to interface with the test system; and cause the controller to read the sense lines to receive a signal associated with respective sense lines; and cause the controller to identify at least one of a presence or an absence of a short or an open between the driven drive line and an adjacent one of the remaining drive lines when the signal is outside the predetermined range, the predetermined range corresponding to a charge associated with a touch panel node.

15. The test system as recited in claim 14, wherein processor is operable to execute the one or more modules to cause the controller to enable at least some of the sense lines while floating others of the sense lines in one or more different combinations and to read the sense lines for detecting a short between two or more of the sense lines.

16. The test system as recited in claim 15, wherein processor is operable to execute the one or more modules to cause the controller to enable a first set of alternate ones of the sense lines and float a second set of alternate ones of the sense lines.

17. The test system as recited in claim 16, wherein processor is operable to execute the one or more modules to cause the controller to thereafter enable the second set of alternate ones of the sense lines and floating the first set of alternate ones of the sense lines.

18. The test system as recited in claim 17, wherein processor is operable to execute the one or more modules to cause the controller to read the sense lines a first time when the first set of alternate ones of the sense lines are enabled and the second set of alternate ones of the sense lines are floating.

19. The test system as recited in claim 18, wherein processor is operable to execute the one or more modules to cause the controller to read the sense lines a second when the second set of alternate ones of the sense lines are enabled and the first set of alternate ones of the sense lines are floating.

20. The test system as recited in claim 19, wherein processor is operable to execute the one or more modules to a location of a short between that at least two of the sense line by comparing the signals read from the sense lines the first time with the signals read from the sense lines the second time.

* * * * *